US008536888B2

(12) United States Patent
Chien et al.

(10) Patent No.: US 8,536,888 B2
(45) Date of Patent: Sep. 17, 2013

(54) BUILT IN SELF TEST FOR TRANSCEIVER

(75) Inventors: Jinn-Yeh Chien, Chu Bei (TW); Hao-Jie Zhan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 442 days.

(21) Appl. No.: 12/981,618

(22) Filed: Dec. 30, 2010

(65) Prior Publication Data

US 2012/0169361 A1 Jul. 5, 2012

(51) Int. Cl.
*G01R 31/3187* (2006.01)

(52) U.S. Cl.
USPC ............... 324/750.3; 324/750.1; 324/756.01; 324/76.82; 324/613; 324/763.01; 714/704; 714/733; 714/734; 714/E11.004; 375/229; 375/231; 375/232; 375/346

(58) Field of Classification Search
USPC ...................................... 324/750.3
See application file for complete search history.

(56) References Cited

U.S. PATENT DOCUMENTS

| | | | |
|---|---|---|---|
| 6,462,527 B1 | 10/2002 | Mancatis | |
| 2004/0120392 A1* | 6/2004 | Searles et al. | 375/219 |
| 2005/0166111 A1* | 7/2005 | Chien | 714/733 |
| 2006/0133468 A1* | 6/2006 | Chen et al. | 375/224 |
| 2008/0226288 A1* | 9/2008 | Miller | 398/9 |
| 2009/0252213 A1* | 10/2009 | Zerbe et al. | 375/231 |
| 2010/0074314 A1* | 3/2010 | Stojanovic et al. | 375/226 |

OTHER PUBLICATIONS

Agilent J-BERT N4903A High-Performance Serial BERT with Complete Jitter Tolerance Testing, 7 Gb/s and 12.5 Gb/s Data Sheet, Version 3.4, New: Increased jitter injection ranges, © Agilent Technologies, Inc., Apr. 2008, 20 pages.
Agilent N4917A Optical Receiver Stress Test Solution, Data Sheet Version 1.2, New: Extension to 10GBase-SR (850 nm MMF) and Support of New Agilent Instruments, . © Agilent Technologies, Inc., Oct. 2010, 12 pages.
Agilent Technologies 81133A and 81134A, 3.35 GHz Pulse Pattern Generators, Data Sheet Version 1.2, . © Agilent Technologies, Inc., Oct. 2007, 11 pages.
Agilent 8163B Lightwave Multimeter, Agilent 8164B Lightwave Measurement System, Agilent 8166B Lightwave Multichannel System, Technical Specifications, . © Agilent Technologies, May 2003, 6 pages.

(Continued)

*Primary Examiner* — Arleen M Vazquez
*Assistant Examiner* — Thang Le
(74) *Attorney, Agent, or Firm* — Duane Morris LLP; Steven E. Koffs

(57) ABSTRACT

An integrated circuit (IC), comprises a receiver on an IC substrate. The receiver is configured to receive a stressed input signal. A built in self test (BIST) circuit is provided on the IC substrate for testing the receiver. The BIST circuit comprises an encoder configured for receiving an input signal and identifying whether a first condition is present, in which two or more consecutive input data bits have the same polarity as each other. An output driver circuit provides the stressed input signal corresponding to the two or more consecutive input data bits. The stressed input signal has an amplitude that is larger when the encoder identifies that the first condition is present and smaller when the encoder identifies that two or more consecutive input data bits have different polarity from each other.

19 Claims, 7 Drawing Sheets

(56) References Cited

OTHER PUBLICATIONS

Agilent Technologies, N4917A Optical Receiver Stress Test Solution, http://www.home.agilent.com/agilent/product.jspx?cc=US&lc=eng&ckey=1084677&nid . . . © Agilent 2000-2010, 4 pages.
Agilent Technologies, 81133A Pulse Pattern Generator, 3.35 GHz, single channel, http://www.home.agilent.com/agilent/product.jspx?pn=81133A, © Agilent 2000-2010, 4 pages.
Agilent Technologies, 8164B Lightwave Measurement System, http://www.home.agilent.com/agilent/product.jspx?id=74026&pageMode=OV&pid=740 . . . © Agilent 2000-2010, 2 pages.
Agilent Technologies, J-BERT N4903A High-Performance Serial BERT with complete jitter tolerance testing[. . . http://www.home.agilent.com/agilent/product.jspx?id=694658&pageMode=OV&pid=69 . . . © Agilent 2000-2010, 4 pages.
U.S. Appl. No. 12/577,396, filed Oct. 12, 2009.

* cited by examiner

BUILT IN SELF TEST FOR TRANSCEIVER

FIELD

The present disclosure relates to semiconductor devices and communications testing.

BACKGROUND

Digital transceivers have been developed to transmit and receive signals according to a variety of protocols, such as SONET, SDH, 10 GbE, PCI Express, SATA, Fibre channel, or the like. As part of the validation process for a transceiver, the transceiver is subjected to a test pattern that has been modulated to include jitter. Jitter in a high-frequency digital signal is manifested by deviation in a characteristic of the pulses, such as amplitude, phase timing, or the width of the signal pulse. Jitter may be caused by electromagnetic interference (EMI) and/or crosstalk with other signals. An important characteristic of a receiver design is its jitter tolerance.

Sophisticated and costly test equipment have been developed to emulate various signal streams that a transceiver may be expected to encounter in actual use, including "stressed" signal streams that have been modulated to include jitter. Unfortunately, the costs of automated test equipment (ATE) and the complexity of integrated circuits are both rising quickly.

DETAILED DESCRIPTION

This description of the exemplary embodiments is intended to be read in connection with the accompanying drawings, which are to be considered part of the entire written description.

Figure 1:
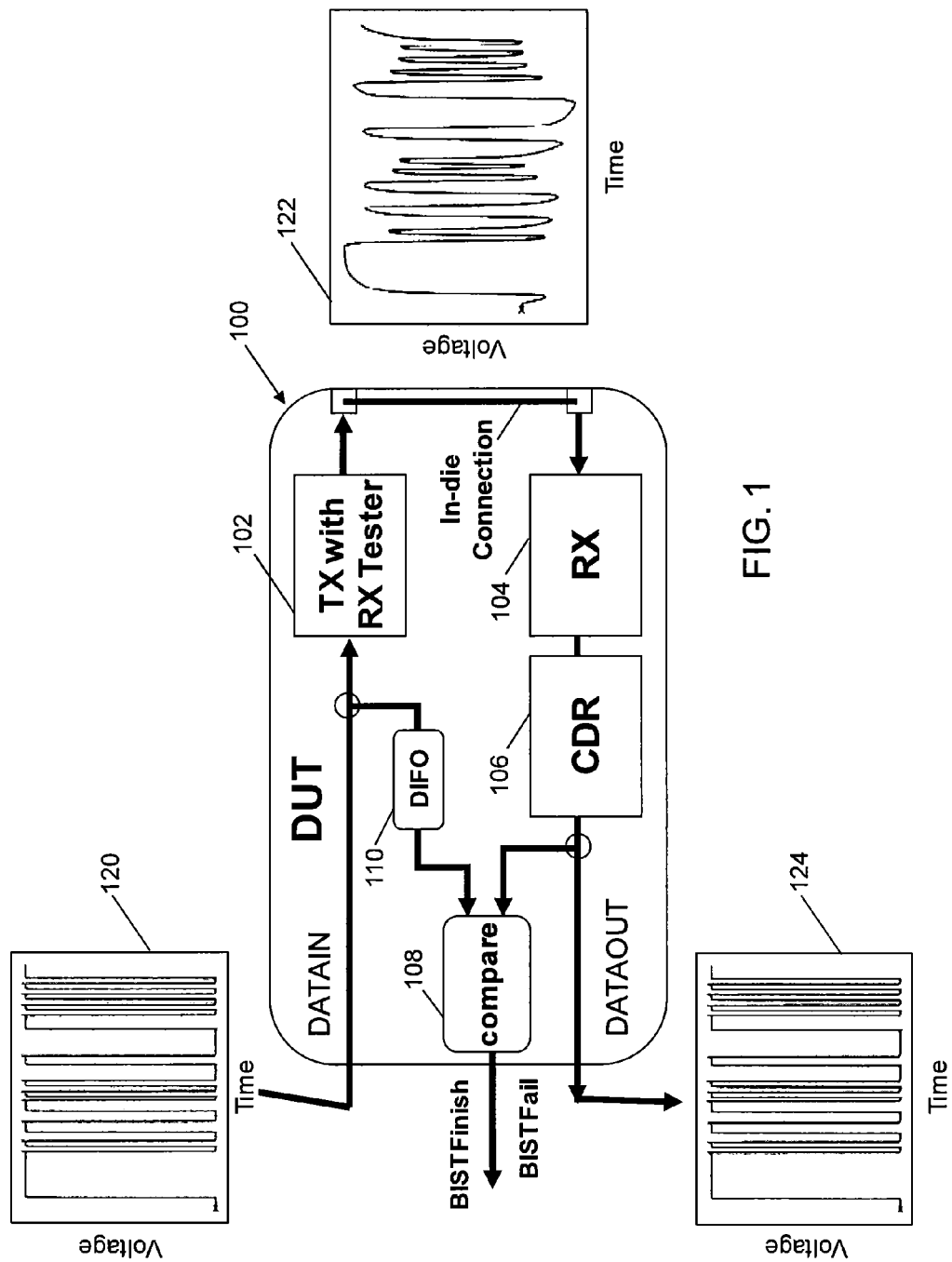
FIG. 1 is a diagram of an integrated circuit (IC) with a built in self test (BIST) function.

FIG. 1 is a diagram of an integrated circuit (IC) 100 comprising a transceiver device under test (DUT) with a built in self test (BIST) function. In some embodiments, the IC 100 is configured to receive a simple input data stream DATAIN (approximating an ideal data stream) without jitter from a relatively simple test pattern generator. The test pattern generator may be external to the IC, such as external test pattern generator 200 shown in FIG. 2. The on-chip BIST circuitry 102 is configured to modify the input signal DATAIN to emulate a stressed signal. The stressed signal simulates such deviations in signal characteristics as may occur when a signal is transmitted through a long cable, for example. The stressed signal 103 is provided to the receiver amplifier 104, and normal clock recovery circuit 106 eliminates jitter within the tolerance of the transceiver 100 to provide an output signal DATAOUT. The input signal DATAIN is compared to the recovered signal DATAOUT, and a bit error rate is determined based on the comparison.

As shown in FIG. 1, the input signal DATAIN from the test pattern generator 200 approximates an ideal pattern 120 having constant magnitude (voltage) and positive or negative polarity. The stressed signal 103 has a more complex pattern 122. Due to RC delays, higher frequency pulses (e.g., pulse 122c) do not reach the steady state HIGH or LOW voltage values before the polarity of the signal reverses and have a significantly smaller voltage (magnitude) than the lower frequency pulses (e.g., pulse 122a). Intermediate frequency pulses (e.g., 122b) more closely approach the steady state voltage before reversing polarity, and thus have an intermediate magnitude. The lowest frequency pulses 122a reach the steady state HIGH or LOW voltage and have a greater amplitude than pulses 122c.

Thus, the stressed signal is characterized by amplitude that varies with the duration of the pulses. In other words, the greater the frequency of the signal, the smaller the amplitude is.

Ideally, the receiver 104, 106 is able to tolerate the jitter, and extract the original data stream. The waveform 124 shows the output stream DATAOUT from the transceiver. To the extent that bits of the output stream DATAOUT differ from the input stream DATAIN, bit errors are detected.

FIG. 1 shows the major blocks of the IC 100. The input stream DATAIN may be provided directly from external terminals of the IC 100, or may be received by way of an intermediate on-chip function. In other embodiments (not shown), the DATAIN stream is generated by another on-chip function.

The DATAIN stream is provided to a delay block 110 DIFO, which may be a latch, for example. DATAIN is also provided to the "TX with RX Tester" block 102, which modulates the amplitude of the signal 103 to emulate an eye-stressed signal 122. With block 122 included on-chip, there is no need for any external receiver stress test solution device. The block 102 provides the eye-stressed signal 103 to the receiver amplifier 104. The clock recovery block 106 generates a clock signal from an approximate frequency reference, and then phase-aligns to the transitions in the stressed signal stream 103 with a phase-locked loop (PLL), not shown. The receiver amplifier 104 and clock recovery block 106 recover the signal stream within the jitter tolerance of the transceiver, to provide the output stream DATAOUT to the comparison block 108. Non-matching bits are detected, and identified.

Figure 2:
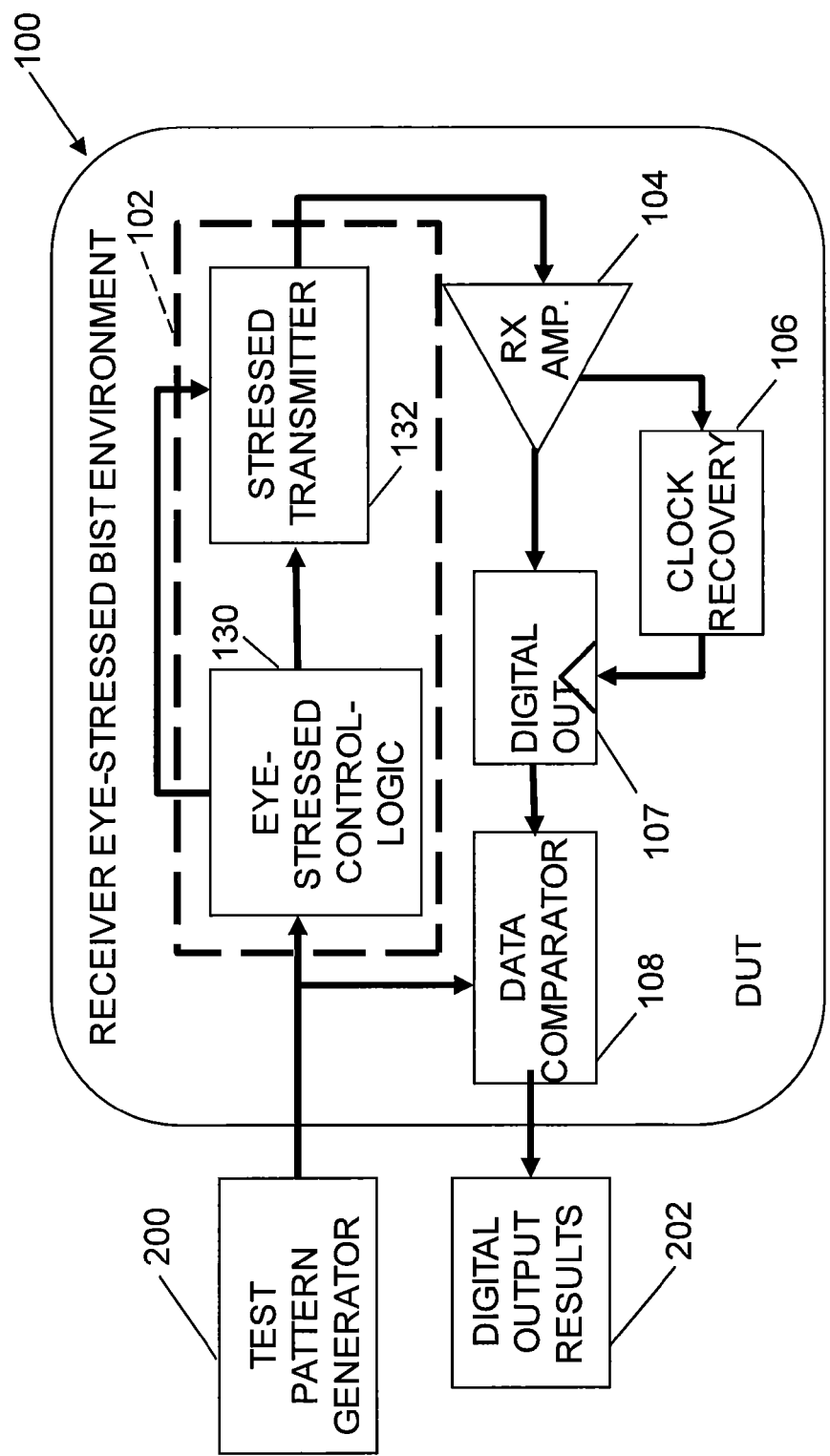
FIG. 2 shows an embodiment of a test system including the IC of FIG. 1.

FIG. 2 shows a system including the IC 100 of FIG. 1. The system includes a test pattern generator (TPG) at least capable of providing an input signal stream that is compliant with the relevant protocol of the transceiver 100, approximating an ideal signal without jitter. For example, TPG 200 may be capable of providing a stream to emulate SONET, SDH, 10 GbE, PCI Express, SATA, Fibre channel, or the like. For this purpose, the TPG 200 need not be capable of providing complex jitter patterns. For example, a relatively inexpensive model 81133A Pulse Pattern Generator sold by Agilent Technologies of Santa Clara, Calif., provides suitable test patterns.

In some embodiments, the BIST circuit block 102 includes two major functions 130, 132.

The eye-stressed control block 130 is an encoder configured for receiving an input signal DATAIN and identifying whether a first condition is present, in which two or more consecutive input data bits have the same polarity as each other. The stressed transmitter 132 includes an output driver circuit for providing the stressed input signal 103 corresponding to the two or more consecutive input data bits. The stressed input signal 103 has an amplitude that is larger when the encoder 130 identifies that the first condition is present and smaller when the encoder identifies that two or more consecutive input data bits have different polarity from each other.

The receiver amplifier 104 on the IC substrate is configured to receive the stressed input signal 103 and provide the amplified signal to the clock recovery block 106 and digital output block 107, which may be a D flip-flop, for example. Digital output block 107 outputs a signal based on the recovered clock signal and the state of the amplified signal. Digital output block 107 outputs a stream having constant amplitude and two polarity values to the data comparator 108. This output stream DATAOUT is thus nearly the same as the delayed version of DATAIN from the latch 110 (FIG. 1), except that any non-matching bits between the delayed DATAIN and DATAOUT are bit errors. The comparator 108 flags the bit errors in a comparator output signal 202, which is received by the digital output results block 202. Block 202 may be included in the TPG 200, or may be a separate module in a computer or data acquisition system (not shown). The bit error rate of the transceiver is then determined from the frequency of bit errors identified by the comparator 108.

Figure 3:
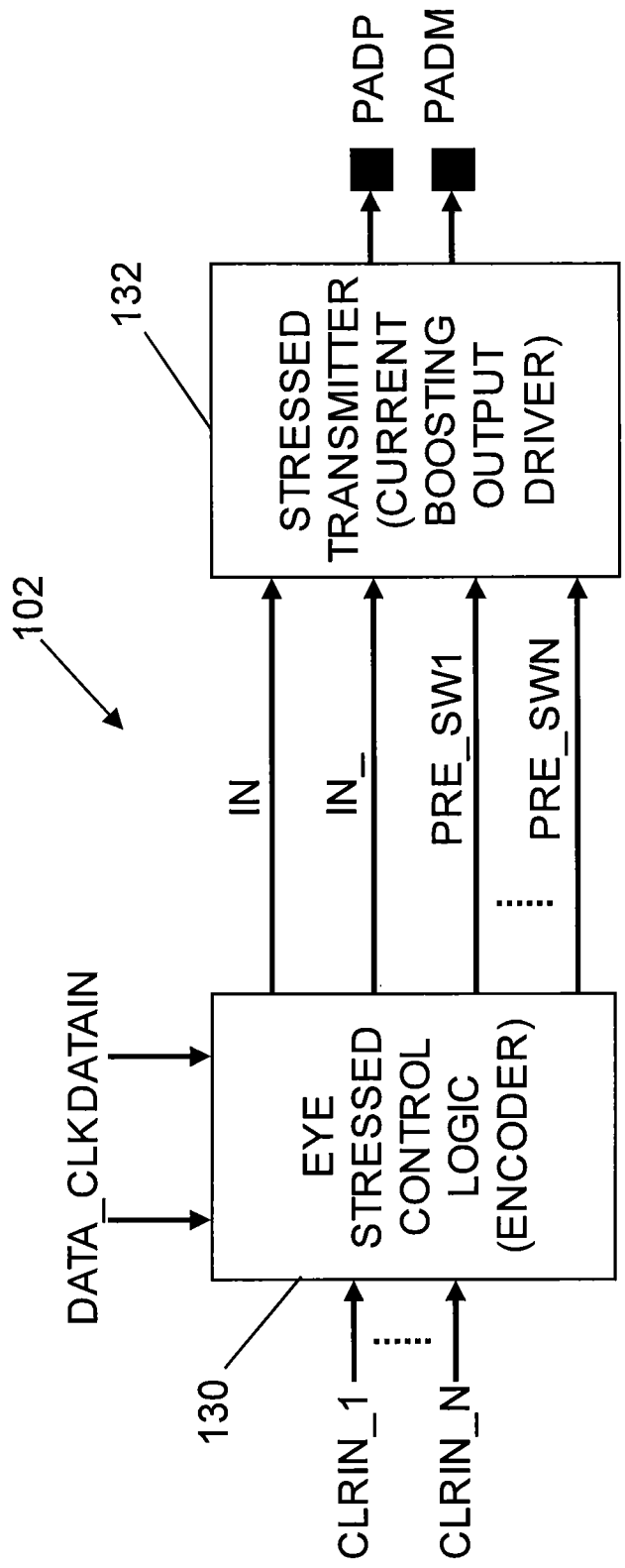
FIG. 3 is a block diagram of the "TX with RX Tester" block of FIG. 1.

FIG. 3 is a block diagram of one embodiment of the "TX with RX Tester" block 102. The eye-stressed control logic block 130 of FIG. 2 is implemented by an encoder that receives a DATA_CLK clock signal and the DATAIN input signal from the TPG 200. The encoder 130 outputs the input stream as IN and its complement as IN_. Optionally, the encoder also receives a plurality of externally supplied configuration input signals CLRIN_1 to CLRIN_N. For each configuration input signal CLRIN_1 to CLRIN_N, a respective output signal PRE_SW1 to PRE_SWN is output from the encoder 130. The outputs PRE_SW1 to PRE_SWN are based on the externally provided inputs CLRIN_1 to CLRIN and on dynamic conditions of the DATAIN stream, as described below. In some embodiments, the dynamic conditions of the DATAIN stream determine whether or not to apply a modulation factor to the DATAIN stream, and the externally provided inputs CLRIN_1 to CLRIN determine the amount of the modulation. In some embodiments the externally provided inputs CLRIN_1 to CLRIN determine the amount of the modulation by configuring a programmable current mirror.

In alternative embodiments, CLRIN_1 to CLRIN are not provided from an external source to block 130. In some embodiments, block 130 uses a configuration that only depends on the dynamic conditions of the DATAIN stream to determine PRE_SW1 to PRE_SWN, and does not depend on externally supplied configuration inputs.

The stressed transmitter (current boosting output driver) block 132 receives the input stream as a differential pair, IN and its complement IN_, and receives the control signals PRE_SW1 to PRE_SWN if they are provided by the encoder 130. In some embodiments, the stressed transmitter block 132 transmits a differential voltage signal PADP, PADM, which is modulated to emulate a stressed input signal. In other embodiments, the output of stressed transmitter block 132 is a single-ended signal. One of ordinary skill can readily modify stressed transmitter to convert a differential signal to a single ended signal, for example using a balun circuit.

Figure 4:
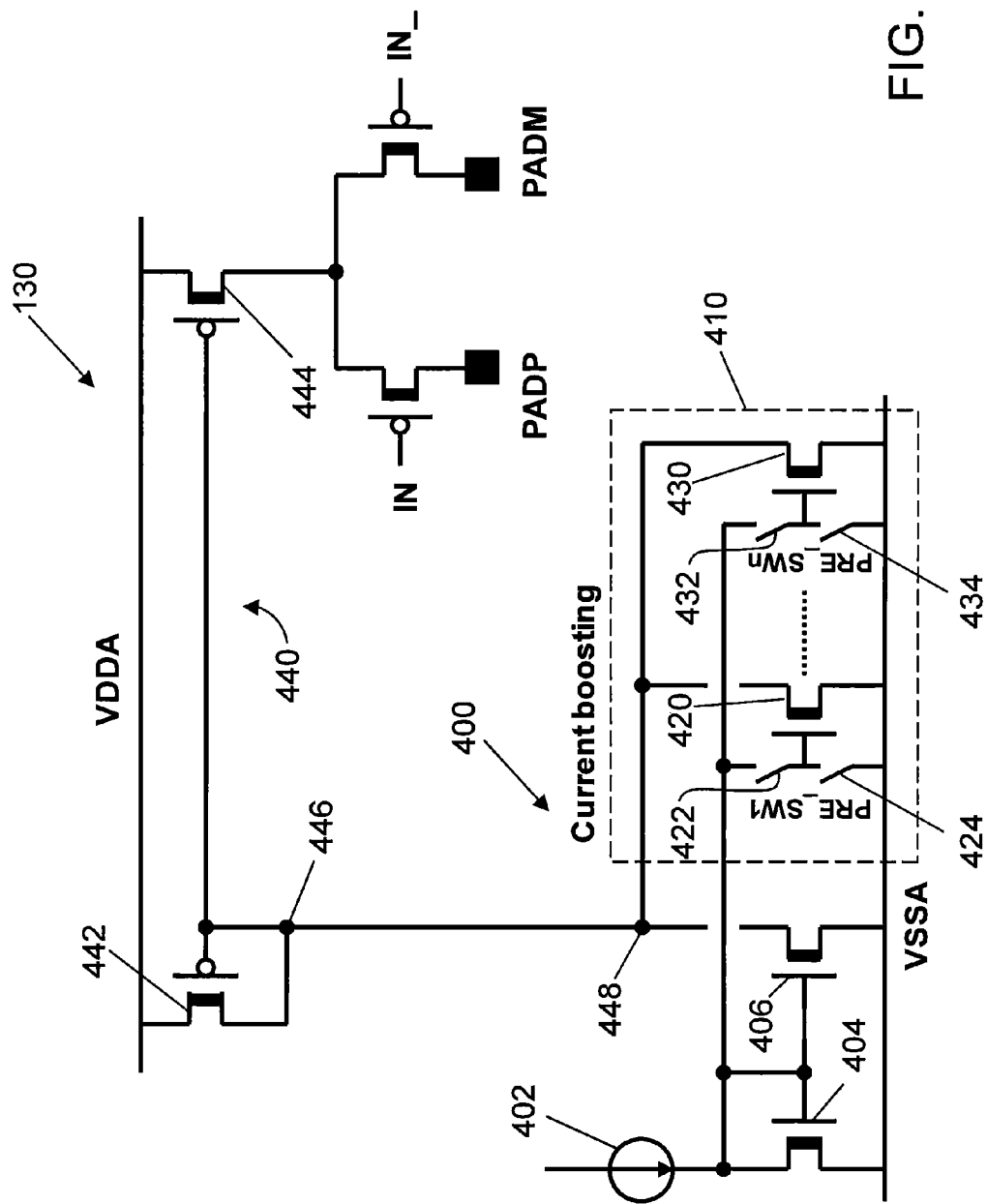
FIG. 4 is a schematic diagram of an embodiment of the stressed transmitter block of FIG. 3.

FIG. 4 is a schematic diagram of an embodiment of the stressed transmitter block (current boosting output driver) 132 of FIG. 3. Block 132 includes three sections: a current bias circuit 440, a current boosting circuit 400 and an output differential pair PADP, PADM.

In some embodiments, the current boosting circuit includes a programmable current mirror circuit 400. A current source 402 provides a reference current to the reference transistor 404 and a first (fixed) mirror transistor 406. The reference transistor 404 has its gate connected to its drain, so that $V_{DG}=0$. One or more second (selectable) mirror transistors 420, 430 are provided. The reference transistor 404 and the first mirror transistor 406 have gates connected to each other.

All the mirror transistors 406, 420 and 430 are connected to each other in parallel, with their drains all connected to each other, and the sources of all the mirror transistors connected to the negative supply rail $V_{SS}$. The one or more (selectable) second mirror transistor 420, 430 are selectively switchable to a connected configuration in which the gates of the one or more of the second mirror transistors 420, 430 are connected to the gate of the reference transistor 404. For example, transistor 420 has a switch 422 for selectively connecting its gate to the gate of reference transistor 404, and a switch 424 for selectively connecting its gate to $V_{SS}$. (At any given time one of the switches 422 and 424 is closed, and the other of switches 422 and 424 is open.). Similarly, second transistor 430 has a switch 432 for selectively connecting the gate of transistor 430 to the gate of reference transistor 404, and a switch 434 for alternatively connecting the gate of transistor 430 to $V_{SS}$. The various switches 422, 424, 432 and 434 may be switching transistors, but other switching elements may be used.

The second mirror transistors 420, 430 are selectively connected in parallel to change the current mirror ratio of current mirror 400. As is understood by one of ordinary skill in the art, the current mirror ratio (ratio of the output current at node 448 to the reference current 402) is given by the ratio of $(W/L)_{MIRROR}/(W/L)_{REFERENCE}$, where W/L is the width-to-length ratio of a transistor. By adding one or more parallel mirror transistor legs (e.g., transistors 420 and 430), the total of the numerator $(W/L)_{MIRROR}$ is increased. The number and individual (W/L) value for each of the second mirror transistor legs 420, 430 are designed to vary the current mirror ratio in any desired range. For example, in some embodiments, the reference transistor 404, first mirror transistor 406 and second mirror transistors 420, 430 are sized so that the current mirror ratio is 1.0 when all of the second mirror transistors 420, 430 have their gates disconnected (switches 422, 432 open and switches 424 and 434 closed); and the current mirror ratio is about 2.0 when all of the second mirror transistors have their gates connected to the gate of reference transistor 404 (switches 422, 432 closed and switches 424 and 434 open). The range of the current mirror ratio is selected to provide a range of currents for varying the bias voltage across its target range. The number of second mirror transistors may be varied to provide any desired number of intermediate current mirror ratios.

FIG. 4 shows an embodiment in which the current mirror ratio is varied by selectively adding mirror transistor legs without varying the reference transistor side of the current mirror. In other embodiments (not shown), the current mirror ratio is varied by selectively connecting parallel transistor legs on the reference transistor side, with all the reference transistor legs having their drains connected to each other and their sources connected to ground, and the programmable reference transistor legs having their gates switchably connectable to the gate of the reference transistor. In another embodiment, the current mirror ratio is varied by switchably connecting parallel transistor legs on both the reference side and the mirror side of the current mirror. In another embodiment, instead of providing a switch between the gate and the source of each second mirror transistor 420, 430, a switch is provided between the gate and drain of each second mirror transistor. Other current mirror designs may also be used.

The bias circuit 440 includes a first transistor 442 and a second transistor 444, each having its drain connected to the positive supply rail $V_{DD}$, and each having its gate connected to node 448 of the current mirror circuit 400. Transistor 442 also has its source connected to its gate at node 446, so that $V_{GS}=0$, and transistors 446 and 444 always have a bias voltage applied at their gates. Transistor 442 and the connected mirror transistors 406, 420, 430 form a voltage divider, so the bias voltage on the gates of transistors 446 and 444 at a given time is determined by the total parallel resistance of the ones of transistors 406, 420 and 430 which are conducting at that time. Thus, when the current is increased by the current boosting circuit 410, the output amplitude of PADP, PADM is also increased.

The input signal IN and its complement IN are each provided to the gate of a respective PMOS transistor 452, 452, to provide the differential voltage PADP, PADM.

The switching of the respective mirror transistor legs for connecting the gates of the second mirror transistors 420, 430 is independently controlled by the respective control signals PRE_SW1 to PRE_SWN. The generation of these signals is described below with reference to FIG. 5.

Figure 5:
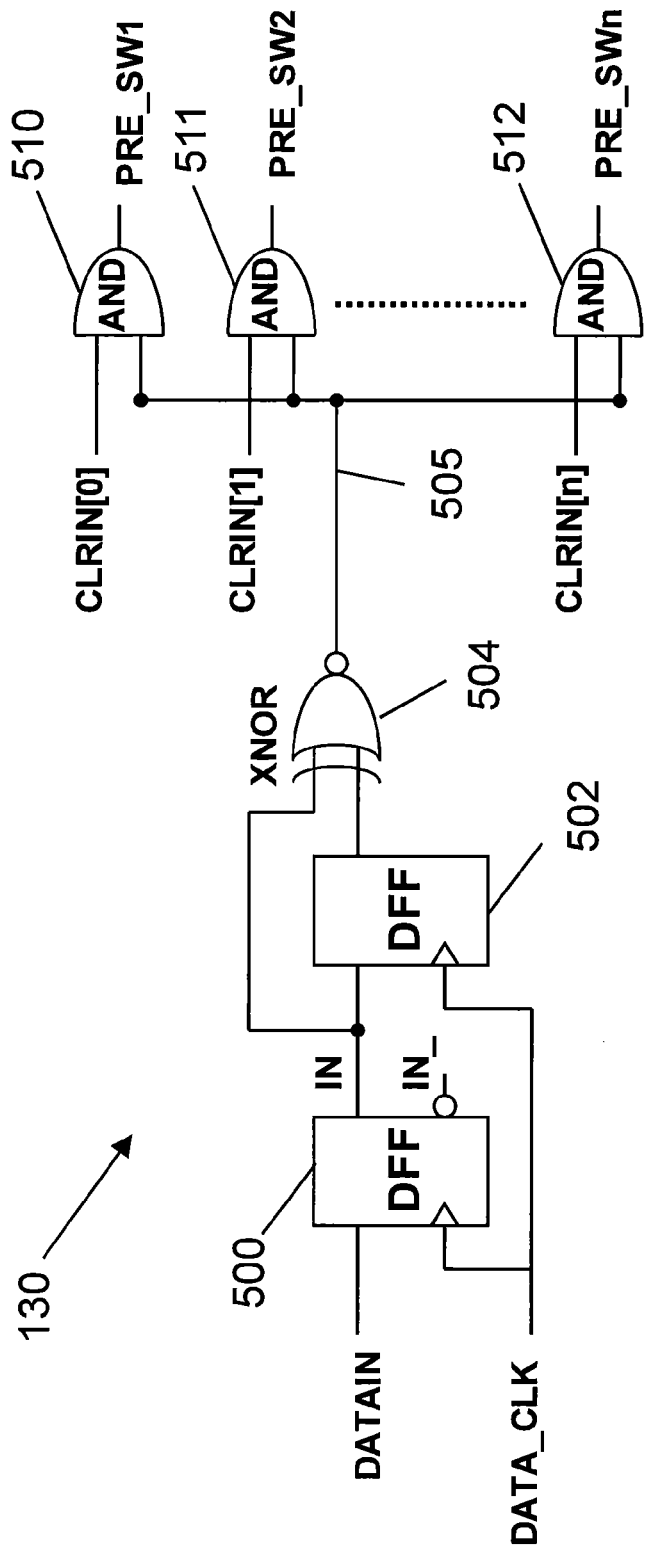
FIG. 5 is a schematic diagram an embodiment of the eye stressed control logic block of FIG. 3.

FIG. 5 is a schematic diagram an embodiment of the eye stressed control logic (encoder) 130 of FIG. 3. In some embodiments, the encoder 130 includes: at least two storage devices 500, 502 for storing at least two consecutive values of the input signal DATAIN; and logic 504 for comparing the two consecutive values and outputting a first signal 505 that indicates whether the two consecutive values are the same or different.

In one embodiment, the DATAIN signal is input to a first D flip flop 500. The DATA_CLK signal is input to the first D flip flop 500 and a second D flip flop 502. The first flip flop 500 outputs the signal DATAIN as IN and its complement as IN_. The IN signal is provided to a second D flip flop 502 and to XNOR gate 504. Thus, the first flip flop 500 stores the current value of DATAIN, and the second flip flop 502 stores the most recent previous value of DATAIN. The second flip flop 502 outputs its value to the other input of the XNOR gate 504. Thus, XNOR gate outputs a logic HIGH when the outputs of both flip flops 500, 502 are the same (i.e., the current value of DATAIN and most recent previous value of DATAIN are the same) and a logic LOW when the outputs of both flip flops 500, 502 are different from each other (i.e., the current value of DATAIN and most recent previous value of DATAIN are different from each other).

In some embodiments, encoder 130 has a respective external input CLRIN[0] to CLRIN[N] corresponding to each respective (selectable) second mirror transistor 420, 430. As noted above, CLRIN[0] to CLRIN[N] determine the amount of the modulation of PADP, PADM. Encoder 130 also includes a respective AND gate 510-512 corresponding to each respective (selectable) second mirror transistor 420, 430. The output of XNOR gate 504 is input to one input of each of the AND gates 510-512. The other input of each AND gate 510-512 receives a respective one of the external input signals CLRIN[0] to CLRIN[N]. Each AND gate 510-512 outputs a respective one of the switching control signals PRE_SW1 to PRE_SWN that are used to independently control the selective connection of the programmable mirror transistors 420, 430. Thus, each AND gate 510-512 outputs a logic HIGH if the external control signal CLRIN[0] to CLRIN[N] corresponding to that AND gate is logic high for selecting the corresponding (programmable) second transistor leg of current mirror 400, and the dynamic conditions of the DATAIN signal are such that two consecutive bits of DATAIN have the same polarity.

Thus the logic 510-512 provides one or more second signals PRE_SW1 to PRE_SWN to configure the output driver circuit 132, responsive to the first signal 505 and one or more respective externally supplied configuration input signals CLRIN[0] to CLRIN[N].

Figure 6:
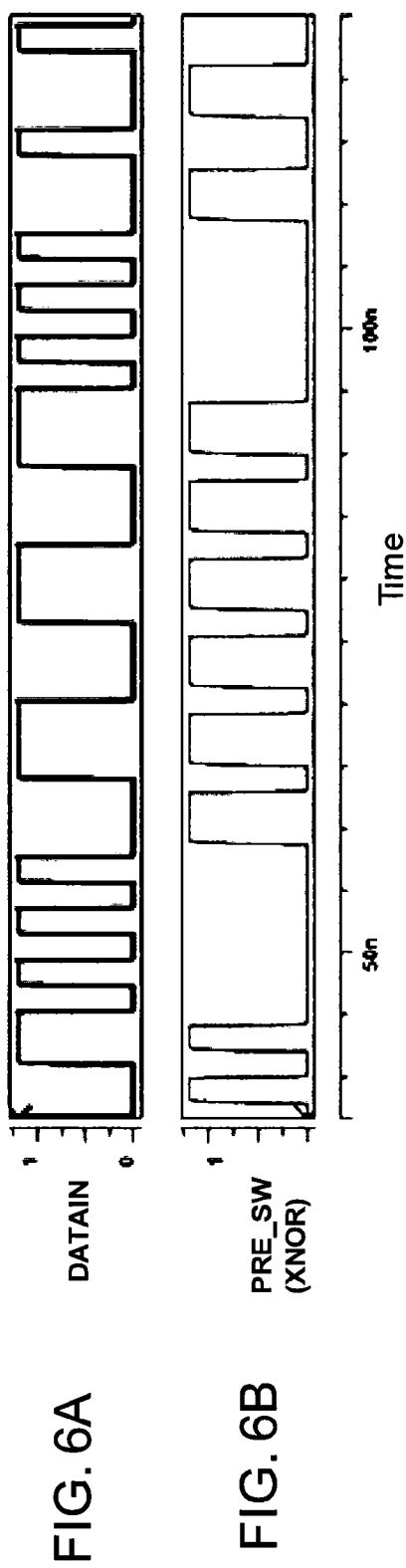
FIG. 6A is a timing diagram of an input signal from the test pattern generator of FIG. 2.
FIG. 6B is a timing diagram of the PRE_SW signal of FIGS. 3 and 5, corresponding to the input signal in FIG. 6A.

FIGS. 6A and 6B are timing diagrams showing the effect of the XNOR logic gate 504 of FIG. 5. FIG. 6A is a timing diagram of an input signal from the test pattern generator 200 of FIG. 2. FIG. 6B is a timing diagram of the output 505 of XNOR gate 504. FIG. 6B also represents the PRE_SW signal of FIGS. 3 and 5, corresponding to the input signal in FIG. 6A, for any programmable current mirror leg having its external input signal CLRIN set to select that leg. In FIGS. 6A and 6B, the duration of each bit is 2.5 nanoseconds. When two consecutive bits have the same polarity (no change in value for at least 5 nanoseconds), signal 505 and the PRE_SW signal of FIG. 6B takes a value of one. Whenever the polarity of DATAIN changes, the value of signal 505 and PRE_SW both return to zero. Thus, the output 505 of the XNOR gate 504 is HIGH whenever the currently received bit of DATAIN matches the most recently received bit; and the PRE_SW signal selectively connects the corresponding programmable current mirror transistor only when DATAIN has the same polarity for at least two consecutive bits.

Figure 7:
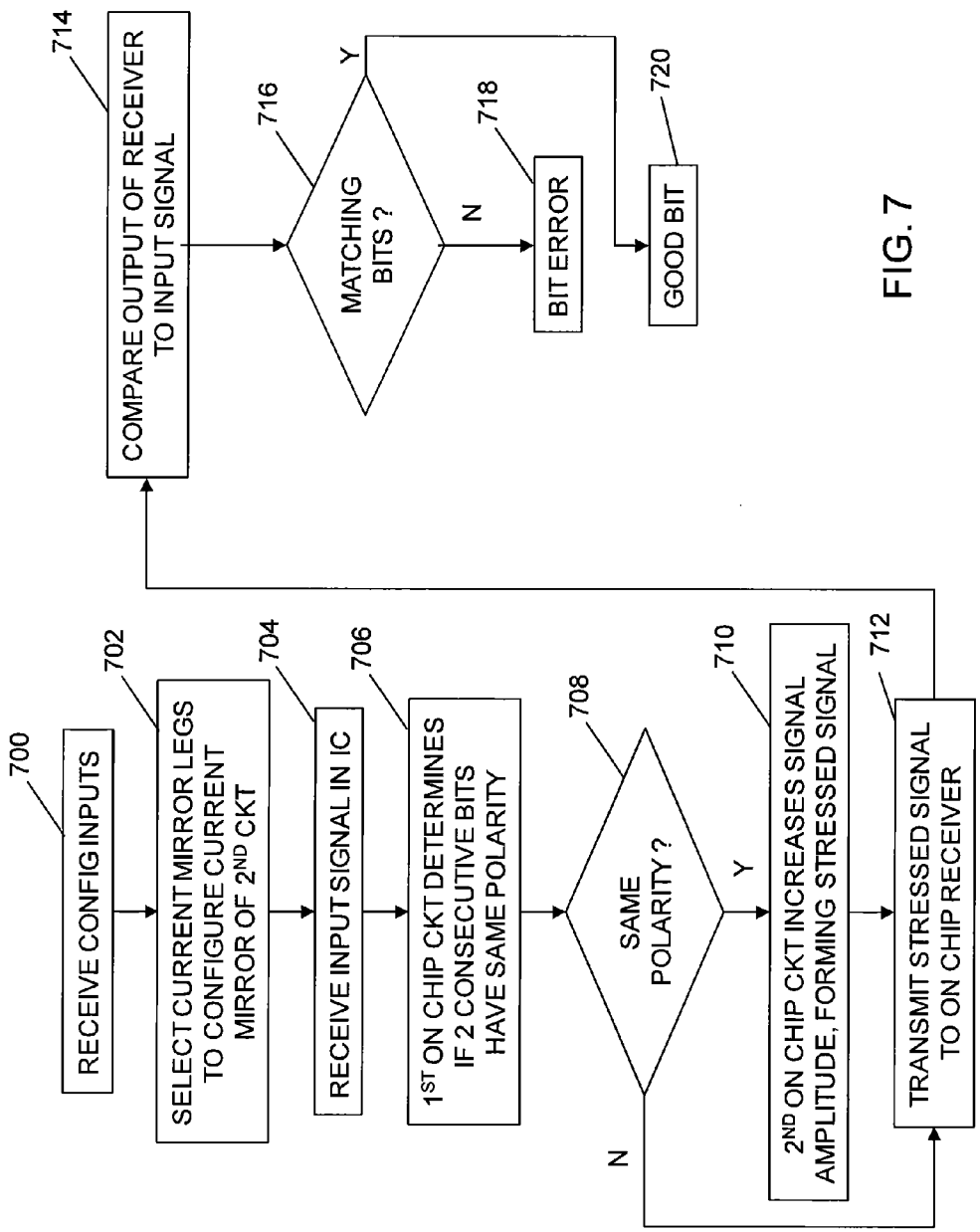
FIG. 7 is a flow chart of a method performed by the IC of FIG. 1.

FIG. 7 is a flow chart of a method of using the IC 100 with BIST.

At step 700, the configuration inputs CLRIN[0] to CLRIN [N] are received by way of the external inputs of the IC 100.

At step 702, the values of CLRIN[0] to CLRIN[N] are provided to AND gate 504 to select which current mirror transistor legs will be connected for increasing the current mirror ratio during the periods when two or more consecutive input bits have the same polarity.

At step 704, the input signal DATAIN is received. This signal approximates an ideal signal stream according to the relevant protocol.

At step 706, the first on chip circuit (encoder 130) determines if two consecutive bits of the input signal DATAIN have the same polarity.

At step 708, if two consecutive bits of the input signal DATAIN have the same polarity, step 710 is performed next. If not, then step 712 is performed next.

At step 710, the second circuit (e.g., current boosting output driver 132) increases the signal amplitude, to form the stressed signal. In some embodiments, this is accomplished by selectively connecting one or more current mirror transistors (selected by their respective PRE_SW control signals) to increase the current mirror ratio. This in turn changes the voltage divider of the bias circuit 440 to increase the bias voltage and the differential signal pair PADP, PADM.

At step 712, the stressed signal is transmitted to the on chip receiver 104.

At step 714, the output of the receiver 104 is compared to the input DATAIN.

At step 716, if the bits matched, step 718 is executed. If not, step 720 is executed.

At step 718, the non-matching bits are identified as a bit error.

At step 720, matching bits indicate a good bit.

At the conclusion of the relevant test period, the bit error rate is determined.

Thus, embodiments are described in which an integrated circuit (IC), comprises a receiver on an IC substrate. The receiver is configured to receive a stressed input signal. A built in self test (BIST) circuit is provided on the IC substrate for testing the receiver. The BIST circuit comprises an encoder configured for receiving an input signal and identifying whether a first condition is present, in which two or more consecutive input data bits have the same polarity as each other. An output driver circuit provides the stressed input signal corresponding to the two or more consecutive input data bits. The stressed input signal has an amplitude that is larger when the encoder identifies that the first condition is present and smaller when the encoder identifies that two or more consecutive input data bits have different polarity from each other.

Method embodiments are described comprising: (a) receiving an input signal in an integrated circuit (IC); (b) using a first circuit within the IC to determine whether or not two consecutive data bits of the input signal have the same polarity; and (c) using a second circuit within the IC to modulate the input signal to increase an amplitude of the two consecutive data bits thereof if the two consecutive data bits of the input signal have the same polarity, thereby to form a stressed signal.

Although the subject matter has been described in terms of exemplary embodiments, it is not limited thereto. Rather, the appended claims should be construed broadly, to include other variants and embodiments, which may be made by those skilled in the art.

What is claimed is:

1. An integrated circuit (IC), comprising:
   a receiver on an IC substrate, the receiver configured to receive a stressed input signal; and
   a built in self test (BIST) circuit on the IC substrate for testing the receiver, the BIST circuit comprising:
      an encoder configured for receiving an input signal and identifying whether a first condition is present, in which two or more consecutive input data bits have the same polarity as each other; and
      an output driver circuit for providing the stressed input signal corresponding to the two or more consecutive input data bits, the stressed input signal having an amplitude that is larger when the encoder identifies that the first condition is present and smaller when the encoder identifies that two or more consecutive input data bits have different polarity from each other.

2. The IC of claim 1, wherein the encoder includes:
   at least two storage devices for storing at least two consecutive values of the input signal; and
   logic for comparing the two consecutive values and outputting a first signal that indicates whether the two consecutive values are the same or different.

3. The IC of claim 2, wherein the storage devices are D flip flops.

4. The IC of claim 3, wherein the logic includes an XNOR gate having inputs connected to outputs of each of the .D flip flops.

5. The IC of claim 2, wherein the encoder further comprises logic for providing one or more second signals to configure the output driver circuit.

6. The IC of claim 5, wherein the logic for providing second signals is responsive to the first signal and one or more respective externally supplied configuration input signals for providing the one or more second signals.

7. The IC of claim 1, wherein the output driver circuit comprises:
   a bias circuit for controlling a bias voltage of the output driver circuit; and
   a programmable current mirror circuit having an adjustable current mirror ratio.

8. The IC of claim 7, wherein the programmable current mirror circuit comprises:
   a current mirror having a reference transistor, a first mirror transistor, and one or more second mirror transistor, wherein:
   the reference transistor and the first mirror transistor have gates connected to each other, and
   the one or more second mirror transistor is selectively switchable to a connected configuration in which the second mirror transistor is connected in parallel with the first mirror transistor, with the gate of the one or more second mirror transistor connected to the gate of the reference transistor.

9. The IC of claim 8, wherein the encoder outputs one or more switch control signal, to one or more respective switching elements for selectively switching the one or more second mirror transistors to the connected configuration.

10. The IC of claim 9, wherein the encoder sets a value of the one or more switch control signal to selectively switch the one or more second mirror transistors to the connected configuration if the first condition is present, and one or more respective externally supplied configuration input signals corresponding to that second mirror transistor is set to a value for switching.

11. The IC of claim 8, wherein the one or more second mirror transistor includes a plurality of second mirror transistors, each independently switchable to the connected configuration.

12. The IC of claim 11, wherein the encoder provides a respective independent control signal for controlling the connection of each respective second mirror transistor, the control signals based on externally generated input signals.

13. The IC of claim 7, wherein the bias circuit includes a first bias transistor having a drain thereof connected to a positive supply rail, a gate thereof connected to the drain of the first mirror transistor, and a source thereof providing a bias voltage for a pair of differential outputs.

14. The IC of claim 1, further comprising:
   an output circuit coupled to the receiver and a clock recovery circuit, for providing a receiver output signal;
   a comparator coupled to compare the input signal to the receiver output signal, the comparator providing a signal indicative of an error if the input signal and the receiver output signal do not match.

15. The IC of claim 1, wherein the receiver is configured for receiving signals according to a protocol from the group consisting of SONET, SDH, 10 Gigabit Ethernet, PCI Express, and SATA.

16. A method comprising:
   (a) receiving an input signal in an integrated circuit (IC);
   (b) using a first circuit within the IC to determine whether or not two consecutive data bits of the input signal have the same polarity; and
   (c) using a second circuit within the IC to modulate the input signal to increase an amplitude of the two consecutive data bits thereof if the two consecutive data bits of the input signal have the same polarity, to form a stressed signal, wherein step (c) includes changing a current minor ratio of a current mirror connected to draw current from a bias circuit that provides a bias voltage of the stressed signal.

17. The method of claim 16, further comprising:
   transmitting the stressed signal to a receiver within the IC; and
   testing the receiver using the stressed signal.

18. The method of claim 17, wherein the testing includes:
- comparing an output signal of the receiver to the input signal, the comparing being performed within the IC; and
- generating an indication of a bit error if the output signal of the receiver does not match the input signal, the indication being generated within the IC.

19. The method of claim 17, wherein the modulating of step (b) includes:
- receiving a plurality of switch control signals from a source external to the IC;
- applying each respective switch control signal to enable or disable connection of a respective switchable transistor leg in parallel with a reference transistor of the current mirror.

* * * * *